United States Patent
Lo et al.

(10) Patent No.: US 9,312,432 B2
(45) Date of Patent: Apr. 12, 2016

(54) GROWING AN IMPROVED P-GAN LAYER OF AN LED THROUGH PRESSURE RAMPING

(75) Inventors: Ming-Hua Lo, Zhongli (TW); Zhen-Yu Li, Chiayai County (TW); Hsing-Kuo Hsia, Jhubei (TW); Hao-Chung Kuo, Tsu-bai (TW)

(73) Assignee: TSMC SOLID STATE LIGHTING LTD., Hsinchu (TW)

( * ) Notice: Subject to any disclaimer, the term of this patent is extended or adjusted under 35 U.S.C. 154(b) by 204 days.

(21) Appl. No.: 13/418,663

(22) Filed: Mar. 13, 2012

(65) Prior Publication Data

US 2013/0240831 A1    Sep. 19, 2013

(51) Int. Cl.
*H01L 33/36* (2010.01)
*H01L 33/32* (2010.01)
*H01L 33/02* (2010.01)
*H01L 33/00* (2010.01)

(52) U.S. Cl.
CPC ............ *H01L 33/025* (2013.01); *H01L 33/325* (2013.01); *H01L 33/36* (2013.01); *H01L 33/007* (2013.01)

(58) Field of Classification Search
None
See application file for complete search history.

(56) References Cited

U.S. PATENT DOCUMENTS

| | | | |
|---|---|---|---|
| 5,391,917 A | 2/1995 | Gilmour et al. | |
| 5,510,298 A | 4/1996 | Redwine | |
| 5,550,391 A | 8/1996 | Yamaguchi | |
| 5,767,001 A | 6/1998 | Bertagnolli et al. | |
| 5,998,292 A | 12/1999 | Black et al. | |
| 6,184,060 B1 | 2/2001 | Siniaguine | |
| 6,194,742 B1 * | 2/2001 | Kern et al. | 372/45.011 |
| 6,322,903 B1 | 11/2001 | Siniaguine et al. | |
| 6,448,168 B1 | 9/2002 | Rao et al. | |
| 6,465,892 B1 | 10/2002 | Suga | |
| 6,472,293 B1 | 10/2002 | Suga | |
| 6,531,328 B1 | 3/2003 | Chen | |
| 6,538,333 B2 | 3/2003 | Kong | |
| 6,599,778 B2 | 7/2003 | Pogge et al. | |
| 6,639,303 B2 | 10/2003 | Siniaguine | |
| 6,664,129 B2 | 12/2003 | Siniaguine | |

(Continued)

FOREIGN PATENT DOCUMENTS

JP    11186607    7/1999

OTHER PUBLICATIONS

US Patent Office, Office Action dated Mar. 16, 2012, U.S. Appl. No. 12/539,757, 16 pages.

(Continued)

*Primary Examiner* — Zandra Smith
*Assistant Examiner* — Molly Reida
(74) *Attorney, Agent, or Firm* — Muncy, Geissler, Olds & Lowe, P.C.

(57) ABSTRACT

The present disclosure involves an apparatus. The apparatus includes a photonic die structure that includes a light-emitting diode (LED) die. The LED die is a vertical LED die in some embodiments. The LED die includes a substrate. A p-doped III-V compound layer and an n-doped III-V compound layer are each disposed over the substrate. A multiple quantum well (MQW) layer is disposed between the p-doped III-V compound layer and the n-doped III-V compound layer. The p-doped III-V compound layer includes a first region having a non-exponential doping concentration characteristic and a second region having an exponential doping concentration characteristic. In some embodiments, the second region is formed using a lower pressure than the first region.

16 Claims, 12 Drawing Sheets

(56) References Cited

U.S. PATENT DOCUMENTS

| | | |
|---|---|---|
| 6,693,361 B1 | 2/2004 | Siniaguine et al. |
| 6,740,582 B2 | 5/2004 | Siniaguine |
| 6,800,930 B2 | 10/2004 | Jackson et al. |
| 6,841,883 B1 | 1/2005 | Farnworth et al. |
| 6,882,030 B2 | 4/2005 | Siniaguine |
| 6,924,551 B2 | 8/2005 | Rumer et al. |
| 6,962,867 B2 | 11/2005 | Jackson et al. |
| 6,962,872 B2 | 11/2005 | Chudzik et al. |
| 7,030,481 B2 | 4/2006 | Chudzik et al. |
| 7,049,170 B2 | 5/2006 | Savastiouk et al. |
| 7,060,601 B2 | 6/2006 | Savastiouk et al. |
| 7,071,546 B2 | 7/2006 | Fey et al. |
| 7,111,149 B2 | 9/2006 | Eilert |
| 7,122,912 B2 | 10/2006 | Matsui |
| 7,157,787 B2 | 1/2007 | Kim et al. |
| 7,193,308 B2 | 3/2007 | Matsui |
| 7,247,565 B2 | 7/2007 | Keum |
| 7,262,495 B2 | 8/2007 | Chen et al. |
| 7,297,574 B2 | 11/2007 | Thomas et al. |
| 7,335,972 B2 | 2/2008 | Chanchani |
| 7,355,273 B2 | 4/2008 | Jackson et al. |
| 7,582,496 B2 | 9/2009 | Lee et al. |
| 7,619,296 B2 | 11/2009 | Nakashiba |
| 2005/0093428 A1 | 5/2005 | Kaneko et al. |
| 2005/0280022 A1 | 12/2005 | Ueda et al. |
| 2006/0124939 A1* | 6/2006 | Lee et al. ............ 257/79 |
| 2007/0108452 A1 | 5/2007 | Kauer |
| 2007/0114545 A1 | 5/2007 | Jang et al. |
| 2008/0001160 A1* | 1/2008 | Andrews ............ 257/79 |
| 2008/0111139 A1 | 5/2008 | Chae et al. |
| 2010/0038674 A1 | 2/2010 | Chen |
| 2011/0241040 A1 | 10/2011 | Yu |
| 2012/0049157 A1* | 3/2012 | Nago et al. ............ 257/13 |
| 2012/0138889 A1* | 6/2012 | Tachibana et al. ....... 257/13 |
| 2012/0171797 A1* | 7/2012 | Kang et al. ............ 438/47 |
| 2013/0221320 A1 | 8/2013 | Li et al. |

OTHER PUBLICATIONS

Chinese Patent Office, Office Action dated Sep. 1, 2010, Application No. 200910166790.x, 6 pages.

Chang, S.J., et al., "Nitride-Based LEDs with an Insulating $SiO_2$ Layer Underneath p-Pad Electrodes," Electrochemical and Solid-State Letters, vol. 10, No. 6, 2007, pp. H175-H177.

Chowdhury,S., et al., "Enhancement and Depletion Mode AlGaN/GaN CAVET with Mg-Ion-Implanted GaN as Current Blocking Layer," IEEE Electron Device Letters, vol. 29, No. 6, Jun. 2008, pp. 543-545.

Huh,C., et al., "Improvement in light-output efficiency of InGaN/GaN multiple-quantum well light-emitting diodes by current blocking layer," Journal of Applied Physics, vol. 92, No. 5, Sep. 1, 2002, pp. 2248-2250.

* cited by examiner

GROWING AN IMPROVED P-GAN LAYER OF AN LED THROUGH PRESSURE RAMPING

TECHNICAL FIELD

The present disclosure relates generally to light-emitting devices, and more particularly, to a light-emitting diode (LED) having a III-V compound layer that has high transparency and low resistance.

BACKGROUND

An LED device or an LED, as used herein, is a semiconductor light source for generating a light at a specified wavelength or a range of wavelengths. LEDs have increasingly gained popularity due to favorable characteristics such as small device size, long lifetime, efficient energy consumption, and good durability and reliability. In recent years, LEDs have been deployed in various applications, including indicators, light sensors, traffic lights, broadband data transmission, and illumination devices. LEDs emit light when a voltage is applied.

LEDs may be made by growing a plurality of light-emitting structures on a growth substrate. The light-emitting structures along with the underlying growth substrate are separated into individual LED dies. At some point before or after the separation, electrodes or conductive pads are added to the each of the LED dies to allow the conduction of electricity across the structure. The light-emitting structure and the wafer on which the light-emitting structure is formed are referred to herein as an epi wafer. LED dies are then packaged by adding a package substrate, optional phosphor material, and optics such as lens and reflectors to become an optical emitter.

LEDs typically include doped III-V compound layers. Traditional methods of forming such doped III-V compound layers may result in degraded LED performance, such as low light output power, low carrier mobility, and excessively high contact resistance or sheet resistance.

Therefore, while existing methods of manufacturing the LEDs have been generally adequate for their intended purposes, they have not been entirely satisfactory in every aspect. A better method of forming doped III-V compound layers for LEDs continues to be sought.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
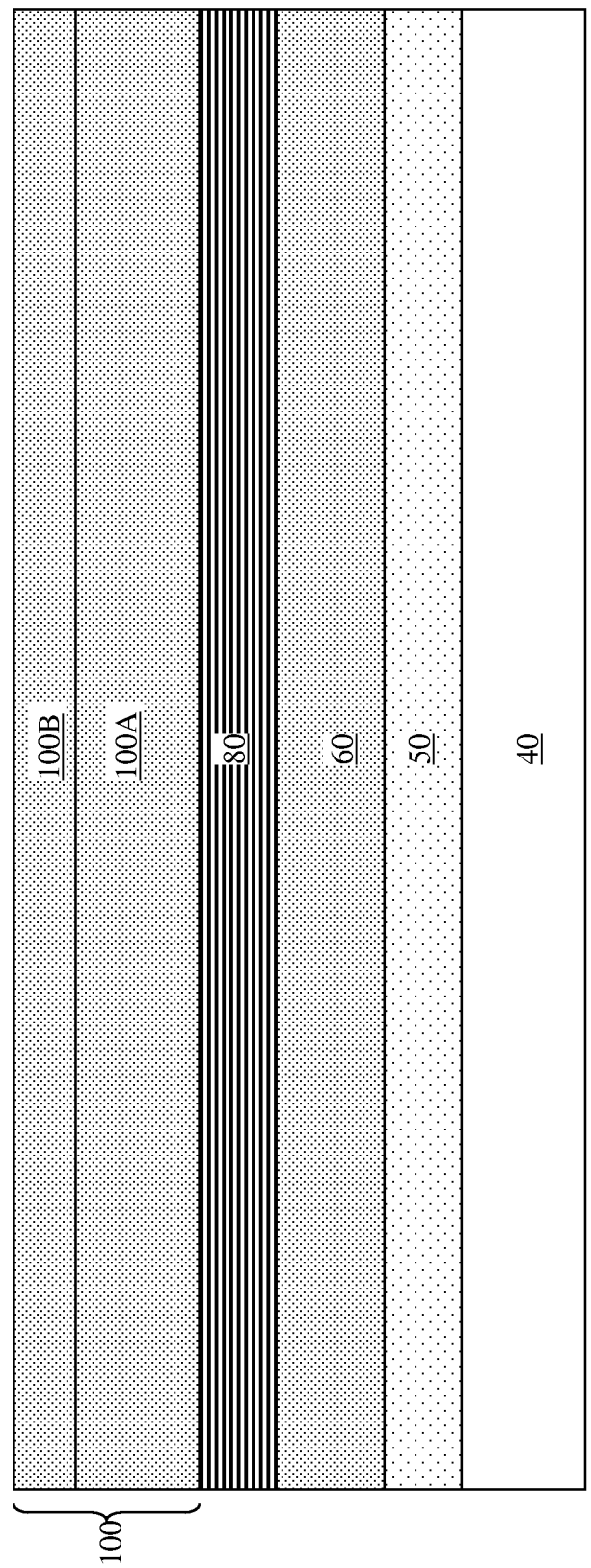
FIGS. 1 and 3-10 are diagrammatic fragmentary cross cross-sectional side views of example LED structures according to various aspects of the present disclosure.

It is understood that the following disclosure provides many different embodiments, or examples, for implementing different features of various embodiments. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. Moreover, the terms "top," "bottom," "under," "over," and the like are used for convenience and are not meant to limit the scope of embodiments to any particular orientation. Various features may also be arbitrarily drawn in different scales for the sake of simplicity and clarity. In addition, the present disclosure may repeat reference numerals and/or letters in the various examples. This repetition is for the purpose of simplicity and clarity and does not in itself necessarily dictate a relationship between the various embodiments and/or configurations discussed.

When turned on, light-emitting diode (LED) devices may emit radiation such as different colors of light in a visible spectrum, as well as radiation with ultraviolet or infrared wavelengths. Compared to traditional light sources (e.g., incandescent light bulbs), LEDs offer advantages such as smaller size, lower energy consumption, longer lifetime, variety of available colors, and greater durability and reliability. These advantages, as well as advancements in LED fabrication technologies that have made LEDs cheaper and more robust, have added to the growing popularity of LEDs in recent years.

Nevertheless, existing LED fabrication technologies may face certain shortcomings. One such shortcoming pertains to the fabrication of a doped III-V compound layer of an LED. A III-V compound contains an element from a "III" group (or family) of the periodic table, and another element from a "V" group (or family) of the periodic table. For example, an LED may include an n-type doped gallium nitride (N—GaN) layer and a p-type doped gallium nitride (P—GaN) layer. For existing LEDs, the fabrication of the doped III-V compound layer (for example the P—GaN layer) may lead to defects within the layer, which may be attributed to a high doping concentration level of the III-V compound layer. The defects within the III-V compound layer may cause device performance degradations, such as reduced light output power due to absorption of light, low carrier mobility (and therefore inadequate current spreading), and excessive forward voltage and high contact and/or sheet resistance.

According to various aspects of the present disclosure, described below is a semiconductor photonic device and a method of fabrication thereof that substantially overcomes these issues discussed above by forming a III-V compound layer with an enhanced fabrication process. The photonic device is an LED in the embodiments discussed below. In more detail, FIGS. 1 and 2-10 are diagrammatic cross-sectional side views of a portion of an LED at various fabrication stages. FIGS. 1 and 2-10 have been simplified for a better understanding of the inventive concepts of the present disclosure.

Referring to FIG. 1, a substrate 40 is provided. The substrate 40 shown herein is a portion of an epi-wafer. In some embodiments, the substrate 40 includes a sapphire material, or silicon carbide, gallium nitride, or silicon. The substrate 40 may have a thickness that is in a range from about 200 microns (um) to about 1000 um.

An undoped semiconductor layer 50 is formed over the substrate 40. The undoped semiconductor layer 50 is free of a p-type dopant or an n-type dopant. In some embodiments, the undoped semiconductor layer 50 includes a compound that contains an element from the "III" group (or family) of the periodic table, and another element from the "V" group (or family) of the periodic table. For example, the III group elements may include boron, aluminum, gallium, indium, and titanium, and the V group elements may include nitrogen, phosphorous, arsenic, antimony, and bismuth. In the illustrated embodiments, the undoped semiconductor layer 50 includes an undoped gallium nitride (GaN) material. Therefore, the undoped semiconductor layer 50 may also be referred to as an U—GaN layer thereafter.

The U—GaN layer 50 serves as a buffer layer (for example, to reduce stress) between the substrate 40 and layers that will be formed over the undoped semiconductor layer 50. To effectively perform its function as a buffer layer, the U—GaN layer 50 has reduced dislocation defects and good lattice structure quality. In certain embodiments, the U—GaN layer 50 has a thickness that is in a range from about 1.5 um to about 3.0 um. In some embodiments, there is no U—GaN layer 50, in other words, the U—GaN layer 50 is not formed.

A doped semiconductor layer 60 is formed over the U—GaN layer 50. The doped semiconductor layer 60 is formed by an epitaxial growth process known in the art. In the illustrated embodiments, the doped semiconductor layer 60 includes an n-type doped III-V group compound, for example an n-type doped gallium nitride (n-GaN) compound. Therefore, the doped semiconductor layer 60 may also be referred to as an n-GaN layer thereafter. The n-type dopant may be carbon (C) or silicon (Si). In some embodiments, the n-GaN layer 60 has a thickness that is in a range from about 2 um to about 4 um.

A pre-strained layer is formed on the n-GaN layer 60. The pre-strained layer may be doped with an n-type dopant such as Silicon. The pre-strained layer may serve to release strain and reduce a quantum-confined Stark effect (QCSE)—describing the effect of an external electric field upon the light absorption spectrum of a quantum well that is formed thereabove (i.e., the MQW layer 80 discussed below). The pre-strained layer may have a thickness in a range from about 30 nm to about 80 nm, but is not specifically illustrated herein for reasons of simplicity.

A multiple-quantum well (MQW) layer 80 is formed over the n-GaN layer 60. The MQW layer 80 includes alternating (or periodic) sub-layers of active material, such as gallium nitride and indium gallium nitride (InGaN). For example, the MQW layer 80 may include a number of gallium nitride sub-layers and a number of indium gallium nitride sub-layers, wherein the gallium nitride sub-layers and the indium gallium nitride sub-layers are formed in an alternating or periodic manner. In one embodiment, the MQW layer 80 includes ten sub-layers of gallium nitride and ten sub-layers of indium gallium nitride, where an indium gallium nitride sub-layer is formed on a gallium nitride sub-layer, and another gallium nitride sub-layer is formed on the indium gallium nitride sub-layer, and so on and so forth. Each of the sub-layers within the MQW layer 80 is doped with a different type of conductivity from its adjacent sub-layer. That is, the various sub-layers within the MQW layer 80 are doped in an alternating p-n fashion. The light emission efficiency depends on the number of layers of alternating layers and their thicknesses. In some embodiments, the MQW layer 80 has a thickness in a range from about 90 nanometers (nm) to about 200 nm.

An electron blocking layer may optionally be formed over the MQW layer 80. The electron blocking layer helps confine electron-hole carrier recombination within the MQW layer 80, which may improve quantum efficiency of the MQW layer 80 and reduce radiation in undesired bandwidths. In some embodiments, the electron blocking layer may include a doped aluminum gallium nitride (AlGaN) material, and the dopant includes magnesium. The electron blocking layer may have a thickness in a range from about 15 nm to about 20 nm, but is not specifically illustrated herein for reasons of simplicity.

A doped semiconductor layer 100 is formed over the MQW layer 80. The doped semiconductor layer 100 is doped with a dopant having an opposite (or different) type of conductivity from that of the doped semiconductor layer 60. Thus, the doped semiconductor layer 100 is doped with a p-type dopant herein. The doped semiconductor layer 100 includes a III-V group compound, which is a gallium nitride compound in the illustrated embodiments. The doped semiconductor layer 100 may thereafter be referred to as a p-type doped gallium nitride (p-GaN) layer. The p-type dopant may be magnesium (Mg). The substrate 40 and the various layers formed thereon may collectively be referred to as an epi-wafer.

As is illustrated in FIG. 1, the p-GaN layer 100 includes a portion 100A that is formed closer to the MQW layer 80, as well as a portion 100B that is formed farther away from the MQW layer 80. The portion 100A may also be referred to as a P− layer, and the portion 100B may also be referred to as a P+ layer. In some embodiments, the p-GaN layer 100 has a thickness that is in a range from about 150 nm to about 200 nm. However, the portion 100A is substantially thicker (i.e., having a greater depth) than the portion 100B. In some embodiments, the portion 100A is at least multiple times thicker than the portion 100B.

According to various aspects of the present disclosure, the portions 100A and 100B are formed under using different pressures. The pressure refers to a chamber pressure during the growth of the layers. In more detail, the portion 100A is formed under a greater pressure environment than the portion 100B. This is done so that the portion 100A will have a lower doping concentration level than the portion 100B, as doping concentration level has a negative (and exponential) correlation with the pressure under which the p-GaN layer 100 is formed. In other words, as pressure remains relatively constant, the doping concentration level of the portion of the p-GaN layer 100 also remains approximately flat, or at least substantially linear with respect to layer depth. In certain embodiments, the portion 100A of the p-GaN layer is grown using a relatively constant pressure and therefore has a flat or linear doping concentration curve. However, as pressure ramps down, the doping concentration level of the portion of the p-GaN layer 100 grown under that pressure will exhibit an exponentially-increasing characteristic with respect to its depth. In certain embodiments, the portion 100B of the p-GaN layer is grown as the pressure is ramped down and therefore has an exponential doping concentration curve.

Figure 2:
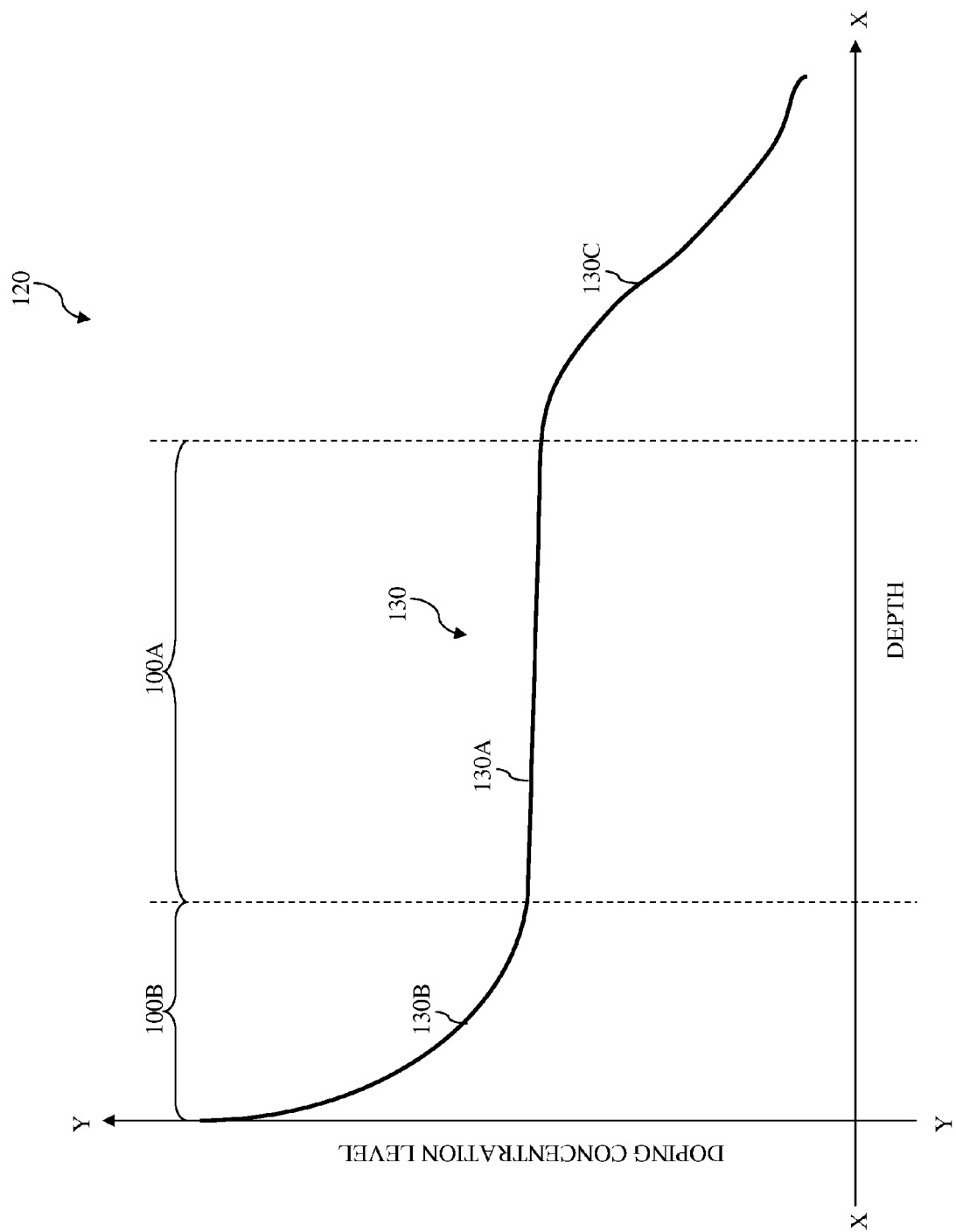
FIG. 2 is an example plot demonstrating the doping concentration curve characteristics of a layer of the LED structure according to various aspects of the present disclosure.

FIG. 2 is a plot 120 that graphically illustrates the above concept in more detail. Referring to FIG. 2, the plot 120 include an X-axis and Y-axis perpendicular to the X-axis. The X-axis represents depth, and the Y-axis represents doping concentration level. The plot 120 contains a curve 130 being plotted with respect to the X and Y axes. The curve 130 includes a segment 130A that corresponds to the properties of the portion 100A of the p-GaN layer, as well as a segment 130B that corresponds to the properties of the portion 100B of the p-GaN layer.

As discussed above, the segment 130A is substantially linear, meaning that although the doping concentration level of the portion 100A is a function of its depth, the doping concentration level does not vary much throughout the portion 100A. For example, the segment 130A may approximately conform to a mathematical equation of $Y=a*X+b$, where X and Y represent depth and doping concentration level, respectively, and where "a" and "b" are constants. This linear behavior of the segment 130A may be achieved by maintaining a relatively constant pressurized environment while the portion 100A of the p-GaN layer is being grown. In some embodiments, the portion 100A is formed under a pressure in a range from about 300 millibars (mbar) to about 1 atmospheric pressure (atm). As a result, the doping concentration level of the segment 130A varies within a range from about $1.0×10^{19}$ ions/centimeter$^3$ to about $1.5×10^{19}$ ions/centimeter$^3$ in these embodiments. Note that the curve 130 also includes a segment 130C that does not correspond to the p-GaN layer, but that corresponds to the diffusion from the layer 100A to the layer 80.

On the other hand, the segment 130B has an exponential profile, meaning that as the portion 100B is being epi-grown (thus varying its depth), the doping concentration level increases exponentially. For example, the segment 130A may approximately conform to a mathematical equation of $Y=a* e^{(b*X)}$, where X and Y represent depth and doping concentration level, respectively, and where "a" and "b" are constants. This exponential behavior of the segment 130B may be achieved by lowering the pressure while the portion 100B of the p-GaN layer is being grown. In some embodiments, the portion 100B is formed under a pressure in a range from about 300 millibars (mbar) to about 760 mbar. As a result, the doping concentration level of the segment 130B varies within a range from about $1.5×10^{19}$ ions/centimeter$^3$ to about $1.5×10^{20}$ ions/centimeter$^3$ in these embodiments. In the embodiments illustrated in FIG. 2, the dopant used for the p-GaN layer 100 is magnesium.

As discussed above and illustrated in FIG. 2, the different portions 100A and 100B of the p-GaN layer exhibit different doping concentration curve characteristics as a function of depth. The portion 100A, which constitutes a substantial majority of the p-GaN layer 100, is grown in a manner such that its doping concentration level is kept relatively low, for example less than about $1.5×10^{19}$ ions/centimeter$^3$. The portion 100B, which constitutes a thin layer of the p-GaN layer 100, is grown in a manner (i.e., by ramping down pressure) such that its doping concentration level is substantially greater (for example at least five times greater) than that of the portion 100A.

The low doping concentration level of the portion 100A is advantageous, because the portion 100A is supposed to be highly transparent so as to allow light generated by the MQW layer 80 to propagate therethrough without absorption (discussed in more detail below), otherwise the light output performance of the LED will suffer. In many conventional LEDs, the entire p-GaN layer is grown at a constant pressure, which results in a p-GaN layer having a highly doped p-GaN layer throughout (for example a doping concentration level greater than about $1.0×10^{20}$ ions/centimeter$^3$). The formation of such highly doped p-GaN layer may lead to many defects, which can absorb light and thereby reduce light output performance of the LED. In comparison, the lower doping concentration level through the substantial majority of the p-GaN layer 100 (i.e., the portion 100A) reduces the presence of light-absorbing defects. Consequently, the LED formed according to the present disclosure will have better light output performance, since light absorption by the p-GaN layer 100 is minimized.

In addition, the high doping concentration level of the portion 100B is advantageous as well, because the portion 100B will be attached to a metal component in a later process. Interfacing with a metal material dictates a high doping concentration level for the portion 100B. In many embodiments, the doping concentration level of the portion 100B is greater than the doping concentration level of p-GaN layers of conventional LEDs. For at least these reasons, the LED formed according to the present disclosure will have lower contact and sheet resistance and lower forward voltage than conventional LEDs. Furthermore, another function of the portion 100B of the p-GaN layer is to perform current spreading. Due to its greater doping concentration level, carrier mobility of the portion 100B is high, and therefore its current spreading performance also exceeds that of conventional LEDs. And though the high doping concentration level of the portion 100B may lead to a higher defect density, this will not have a significant adverse impact on the overall light absorption performance of the p-GaN layer 100, since the portion 100B is only a very small portion of the entire p-GaN layer.

Based on at least the reasons discussed above, the p-GaN layer 100 according to the present disclosure can simultaneously achieve good light output performance as well as good electrical performance such as low resistance and voltage. This is accomplished by growing the p-GaN layer in two stages that each have their own associated pressure. By adjusting the pressure during its formation, the p-GaN layer 100 has a highly doped portion where a high doping concentration level is desired (i.e., the surface portion that will interface with a metal material), and a lower doped portion where a low (or moderate) doping concentration level is desired (i.e., the majority of the p-GaN layer). In other words, whereas the conventional LED may indiscriminately form the entire p-GaN layer with a high doping concentration level, the LED formed herein has a high doping concentration level where it is desired to be high, and a low doping concentration level where it is desired to be low.

Figure 3:
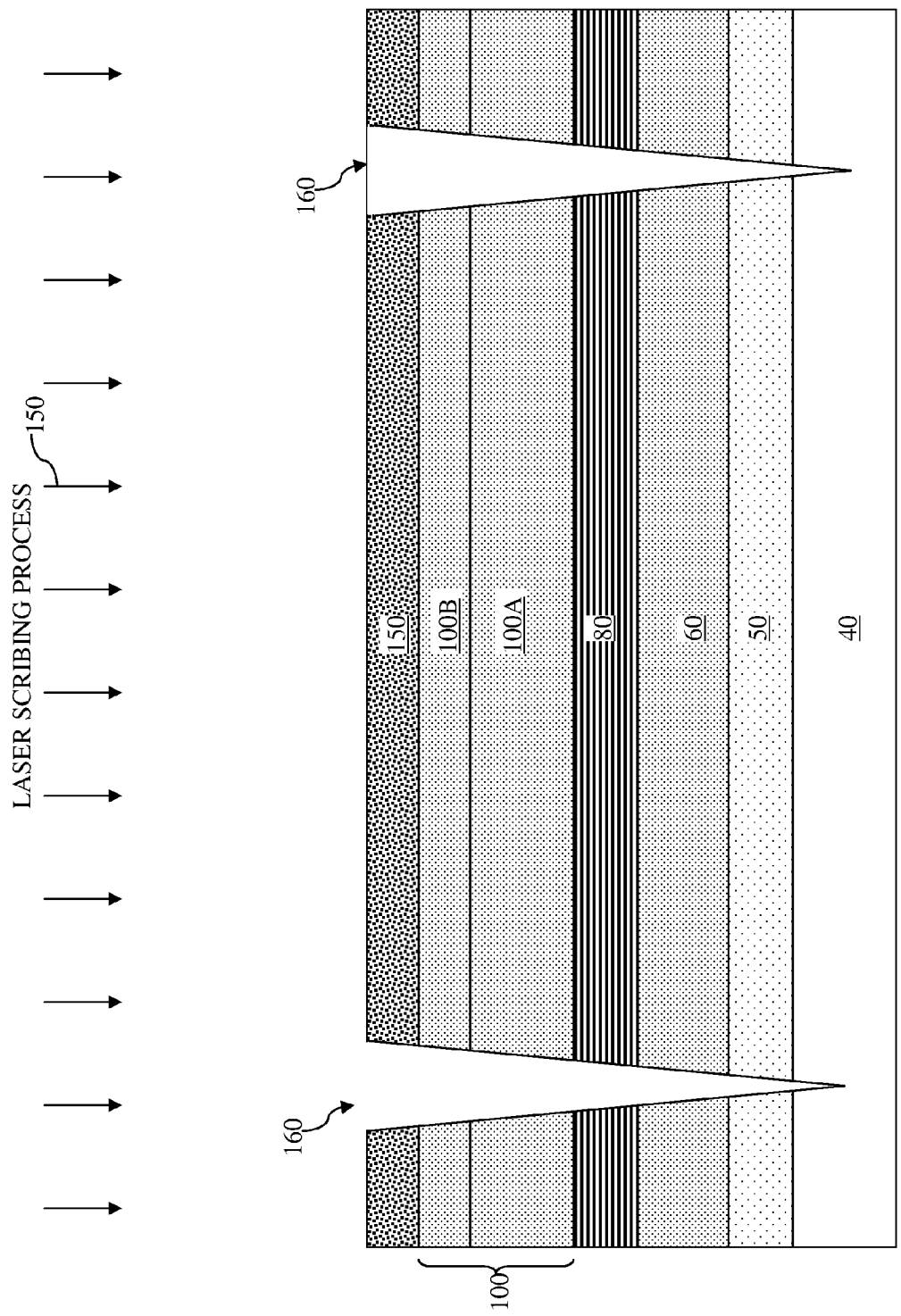

Referring now to FIG. 3, a core portion of the LED is created by the disposition of the MQW layer 80 between the doped layers 60 and 100. When an electrical voltage (or electrical charge) is applied to the doped layers of the LED 30A, the MQW layer 80 emits radiation such as light. The color of the light emitted by the MQW layer 80 corresponds to the wavelength of the radiation. The radiation may be visible, such as blue light, or invisible, such as ultraviolet (UV) light. The wavelength of the light (and hence the color of the light) may be tuned by varying the composition and structure of the materials that make up the MQW layer 80.

A passivation layer 150 is formed over the p-GaN layer 100. In some embodiments, the passivation layer 150 contains silicon oxide, silicon nitride or the combination thereof. Thereafter, a laser scribing process 160 is performed to form openings 160 in the epi-wafer. The openings 160 may extend into the substrate 40.

Figure 4:
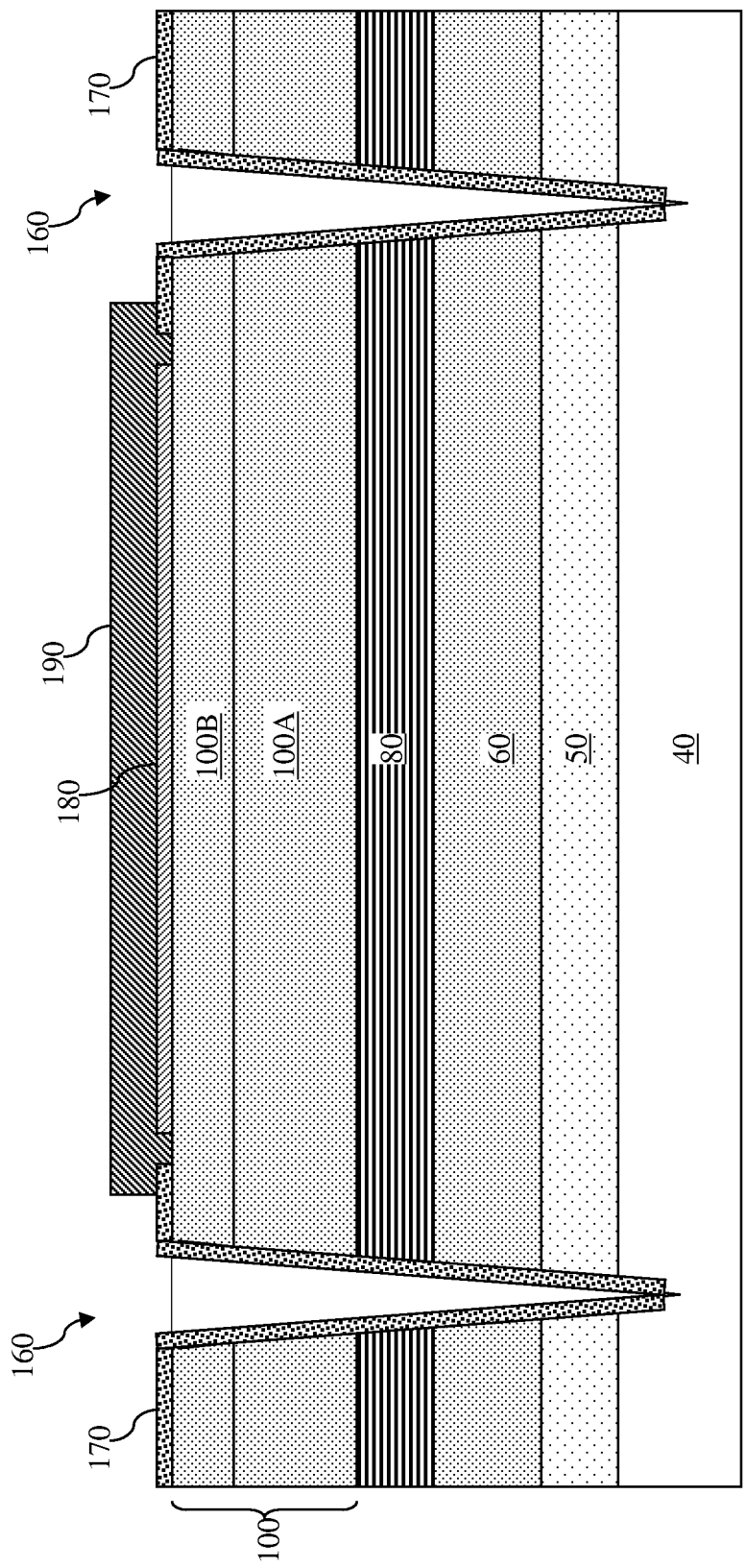

Referring now to FIG. 4, the passivation layer 150 is removed. Another passivation layer 170 is formed over the epi-wafer, including in the openings 160. In some embodiments, the passivation layer 170 contains silicon oxide, silicon nitride or the combination thereof. A photolithography process is then performed to form a metal layer 180 over the p-GaN layer 100B and between the openings 160. The photolithography process may include one or more deposition, exposing, baking, developing, and etching processes (not necessarily in that order). In some embodiments, the metal layer 180 contains nickel (Ni). Thereafter, another photolithography process is performed to form a metal layer 190 over the metal layer 180. In some embodiments, the metal layer 190 contains silver (Ag). The metal layers 180 and 190 can reflect light emitted by the MQW layer 80.

Figure 5:
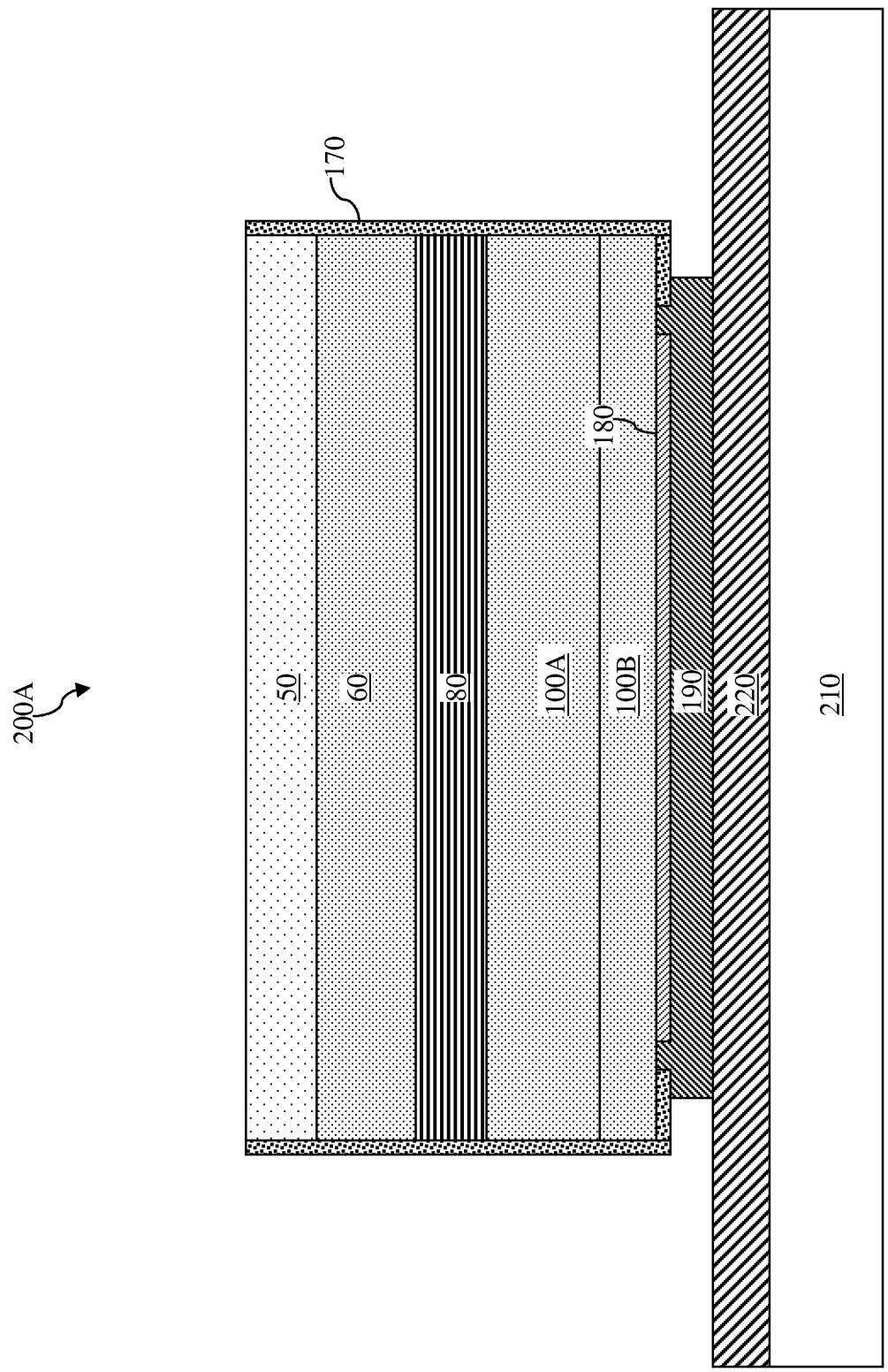

Referring now to FIG. 5, the epi-wafer undergoes a breaking process along the openings 160. In other words, a plurality of individual LED dies 200 are formed by breaking the epi-wafer. The LED die 200A shown in FIG. 5 is then "flipped" vertically upside down and bonded to a substrate 210 having a bonding metal layer 220 disposed thereon. In other words, the metal layer 190 is bonded to the substrate 210 through the bonding metal layer 220. In some embodiments, the substrate 210 is a silicon substrate, and the bonding metal layer includes titanium (Ti), platinum (Pt), gold (Au), gold tin (AuSn), or alloys thereof. The substrate 40 is then removed from the LED die 200A, for example through a laser lift-off process.

Figure 6:
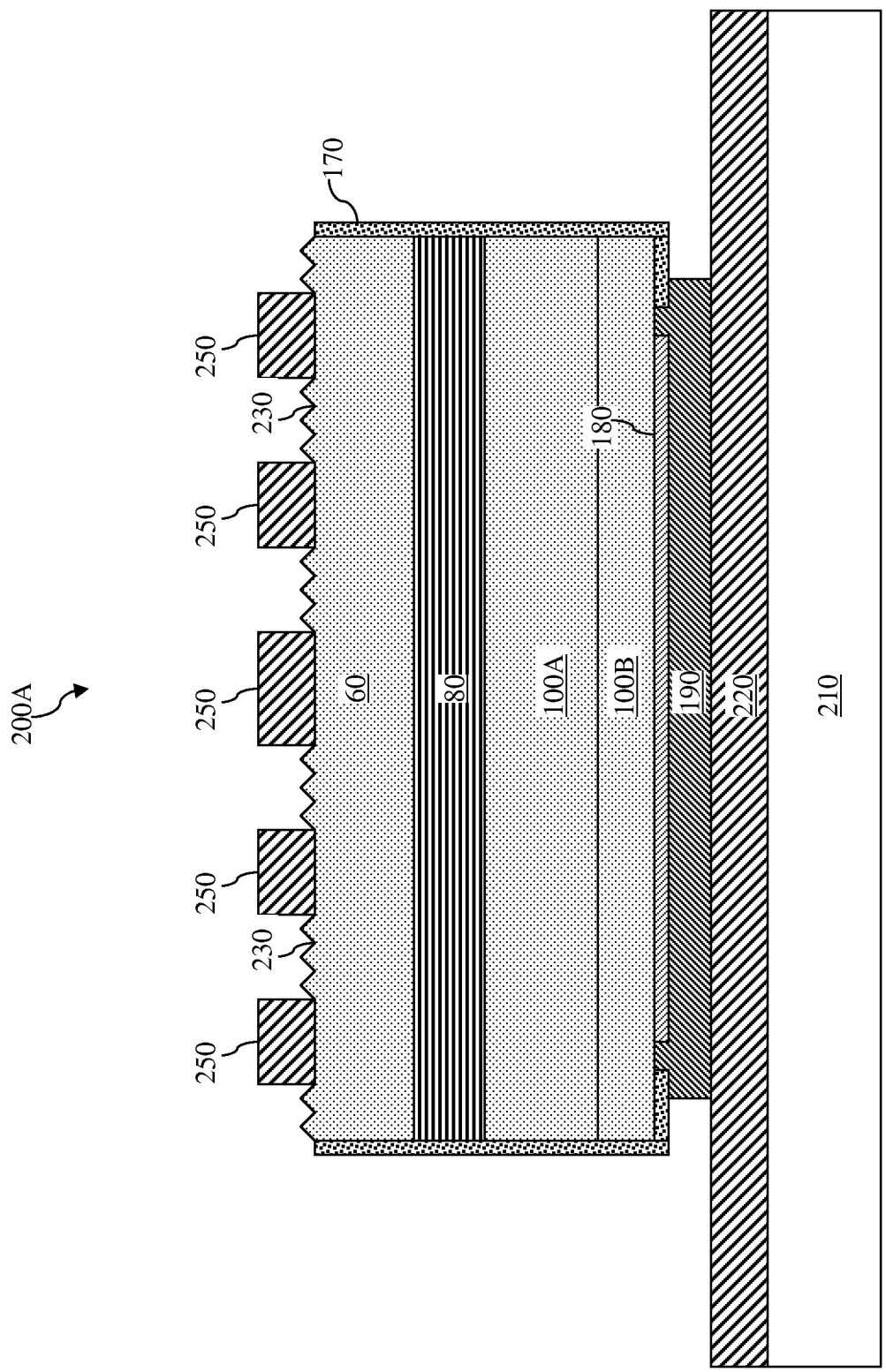

Referring now to FIG. 6, the U—GaN layer 50 is removed, for example through a suitable etching process. The exposed surface of the n-GaN layer 60 then undergoes a roughening process so as to form a roughened surface 230. In other words, the roughened surface 230 of the n-GaN layer is made to be not smooth to diffuse or scatter light emitted by the MQW layer 80. As a result, light propagating through the LED die 200A can achieve better light output uniformity. In some embodiments, the roughening process includes an etching process using potassium hydroxide (KOH) as an etchant.

After the roughening process is performed, another passivation layer is formed to coat around the LED die 200A. The passivation layer may include silicon oxide, silicon nitride or the combination thereof. For reasons of simplicity, this passivation layer is not illustrated herein. A plurality of metal contacts 250 are then formed over the n-GaN layer 60. The metal contacts 250 may be formed through suitable deposition and lithography processes. The metal contacts 250 allow for electrical access to the n-GaN layer.

To complete the fabrication of the LED, additional processes such as packaging and testing processes may also be performed, but they are not illustrated herein for the sake of simplicity.

Figure 7:
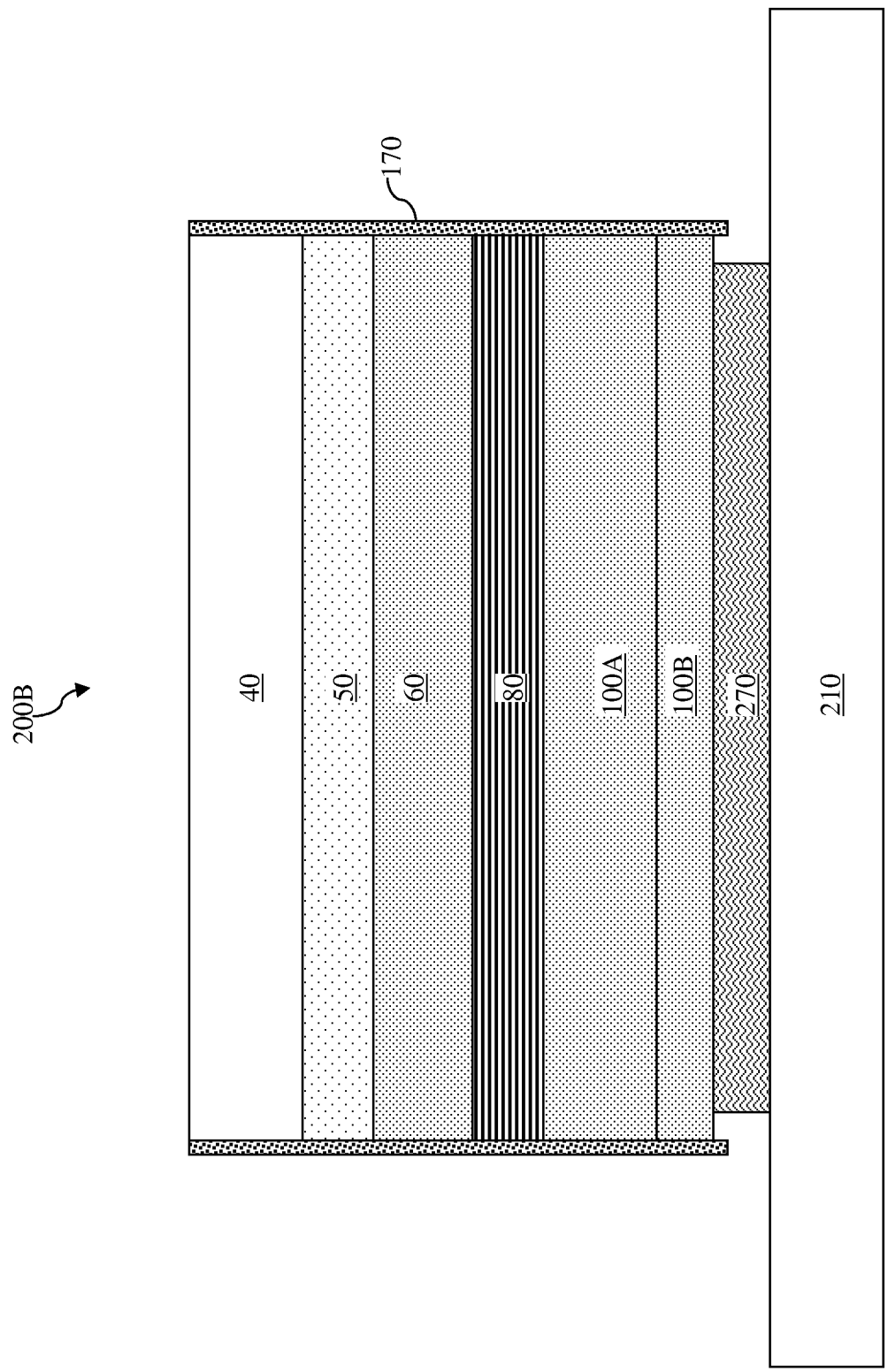
Figure 8:
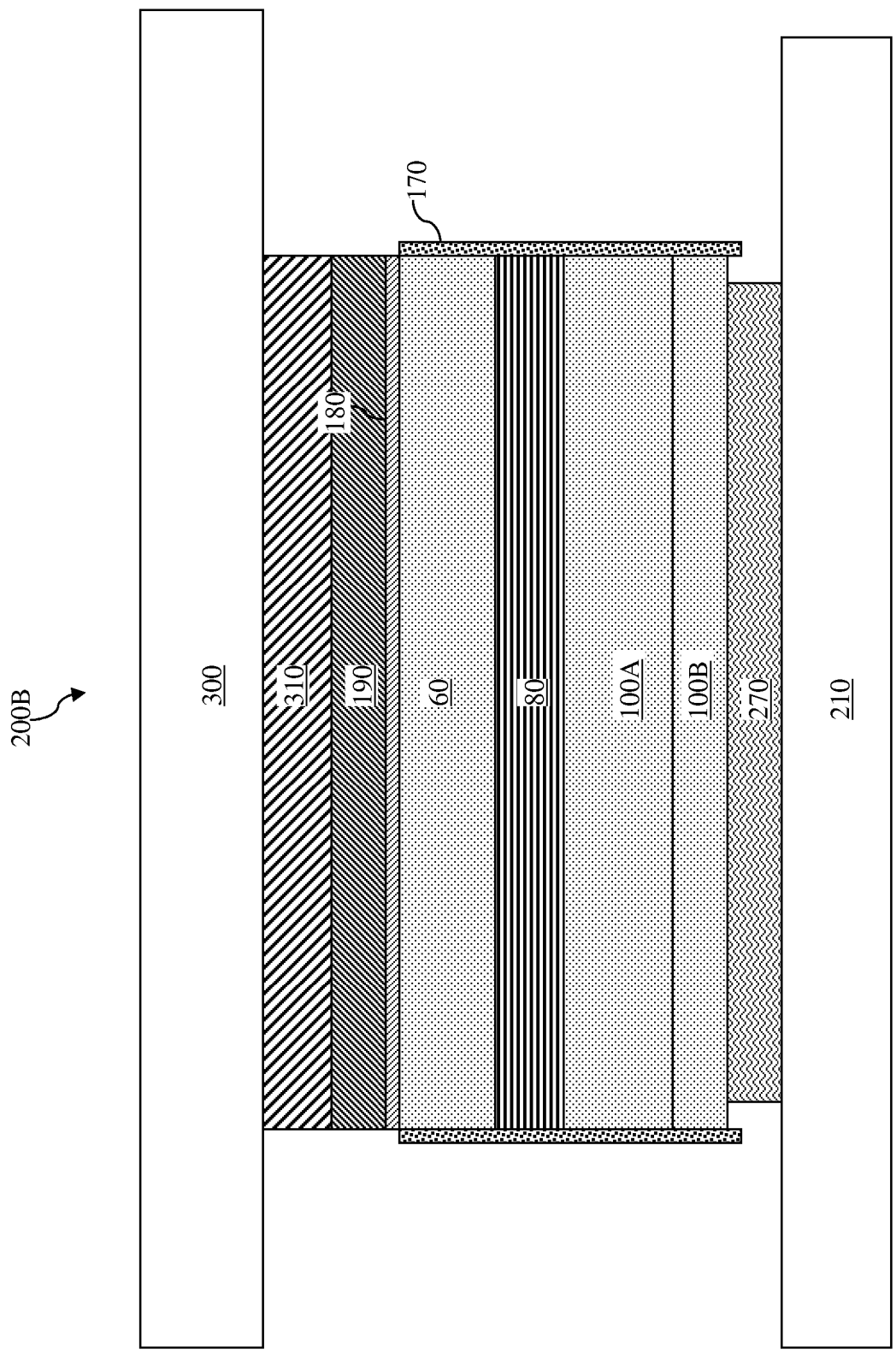
Figure 9:
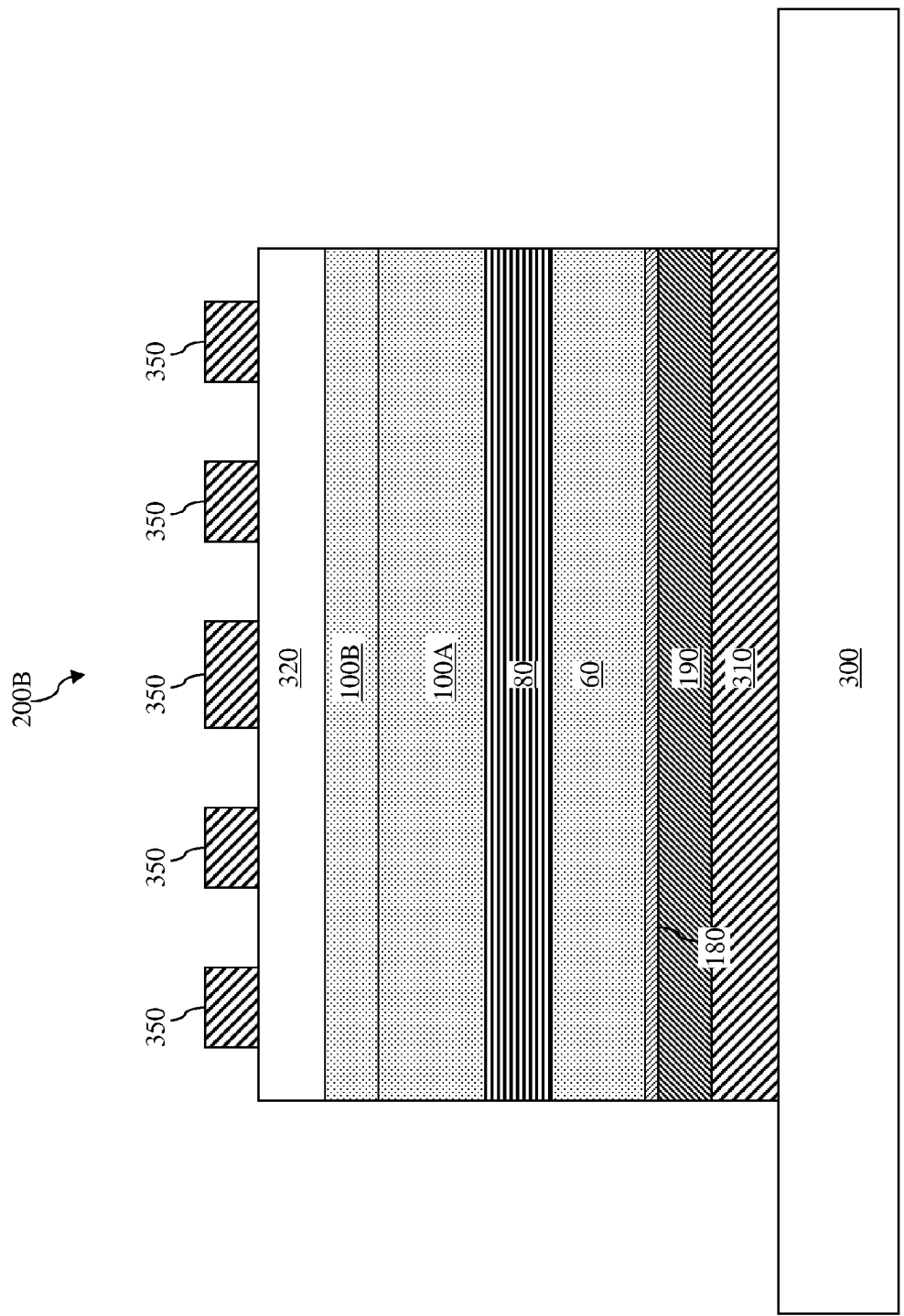

FIGS. 1-6 and the discussions above describe embodiments of a vertical LED die. FIGS. 7-9 and the discussions below describe alternative embodiments of a vertical LED die. For reasons of consistency and clarity, similar components of all the embodiments of the vertical LED die are labeled the same throughout all of these Figures.

FIG. 7 is a diagrammatic cross-sectional side view of an LED die 200B at a stage of fabrication. The LED die 200B includes a substrate 40, an U—GaN layer 50 formed on the substrate 40, an n-GaN layer 60 formed on the U—GaN layer 50, an MQW layer 80 formed on the n-GaN layer 60, and a p-GaN layer 100 formed on the MQW layer 80. As discussed above, the p-GaN layer 100 includes portions 100A and 100B that are formed with different pressures, so that the portions 100A-100B have different doping concentration curve characteristics. The LED die 200B is bonded to the substrate 210 through a bonding material 270. The bonding material 270 may include a flux material, as the LED die 200B may be flux bonded to the substrate 210.

Referring now to FIG. 8, the substrate 40 is removed, for example through a laser lift off process. The U—GaN layer 50 is subsequently removed as well, for example through a suitable etching process. Unlike the vertical LED die 200A discussed above, no roughening process is necessary for the vertical LED die 200B herein. Instead, the metal layer 180 is formed on the n-GaN layer 60. In some embodiments, the metal layer 180 contains nickel. The metal layer 190 is then formed on the metal layer 190. In some embodiments, the metal layer 190 contains silver. As discussed above, the metal layers 180 and 190 may serve as reflector layers (i.e., to reflect light emitted by the MQW layer 80).

The LED die 200B is then bonded to a substrate 300 through a metal bonding layer 310. In certain embodiments, the substrate 300 contains similar materials as the substrate 210, and the metal bonding layer 310 contains similar materials as the metal bonding layer 220 of the vertical LED die 200A discussed above.

Referring now to FIG. 9, the substrate 210 is removed, as is the bonding material 270 that was used to bond the substrate 210 to the LED die 200B. The LED die 200B is then shown "flipped" vertically upside down. Thereafter, a transparent contact layer 320 is formed on the p-GaN layer 100 (in more detail, on the portion 100B of the p-GaN layer). In some embodiments, the transparent contact layer 320 contains indium titanium oxide (ITO). Thereafter, metal contacts 350 (also referred to as contact pads) are formed on the transparent contact layer 320. The metal contacts 350 may be formed through suitable deposition and lithography processes. The metal contacts 350 allow for electrical access to the p-GaN layer 100. In addition, a passivation layer may be formed to coat around the surfaces of the LED die 200B, but the passivation layer is not specifically illustrated herein for reasons of simplicity.

Compared with the vertical LED die 200A discussed above, the vertical LED die 200B is vertically "flipped" upside down. In other words, the metal contacts 350 are formed on the p-GaN layer 100 for the vertical LED 200B, rather on the n-GaN layer 60 as was the case for the vertical LED 200A. This is accomplished by performing an additional substrate bonding process. The vertical LED die 200B still enjoys the same advantages of the vertical LED die 200A discussed above.

Figure 10:
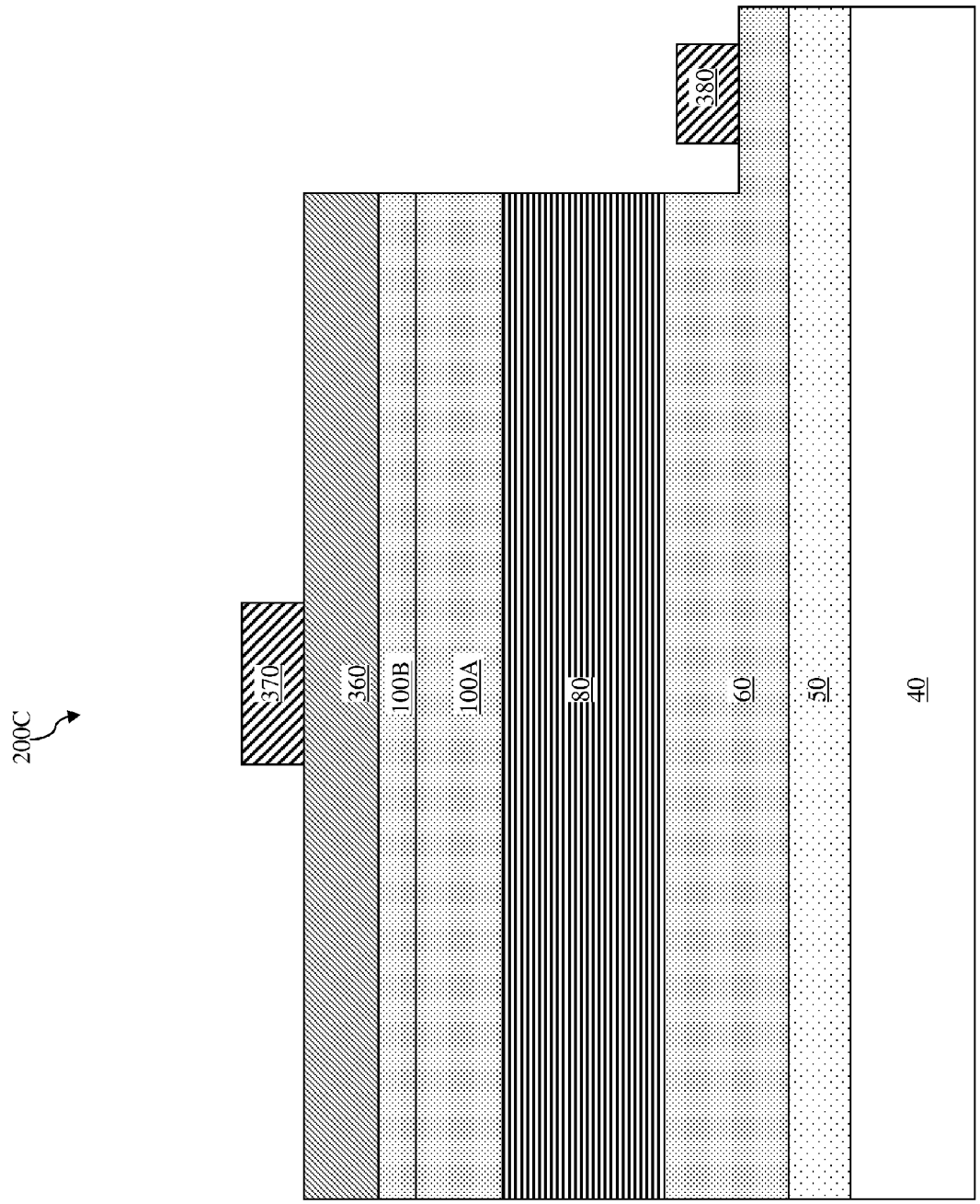

Though the embodiments discussed above pertain to a vertical LED die, it is understood that the same concepts discussed above may apply to a horizontal LED die as well. As an example, an embodiment of a horizontal LED die 200C is shown in FIG. 10. For reasons of clarity and consistency, similar components are labeled the same for the horizontal LED die 200C as for the vertical LED dies 200A-200B. The horizontal LED die 200C includes a substrate (for example a sapphire substrate) 40, a U—GaN layer 50 formed on the substrate 40, an n-GaN layer 60 formed on the U—GaN layer 50, an MQW layer 80 formed on the n-GaN layer 60, and a p-GaN layer 100 formed on the MQW layer 80. As discussed above, the p-GaN layer 100 includes portions 100A and 100B that are formed with different pressures, so that the portions 100A-100B have different doping concentration curve characteristics. A contact layer 360 is formed on the p-GaN layer 100. Metal contacts 370 and 380 are formed on the contact layer 360 and the n-GaN layer 60, respectively, which give electrical access to the LED die 200C.

Figure 11:
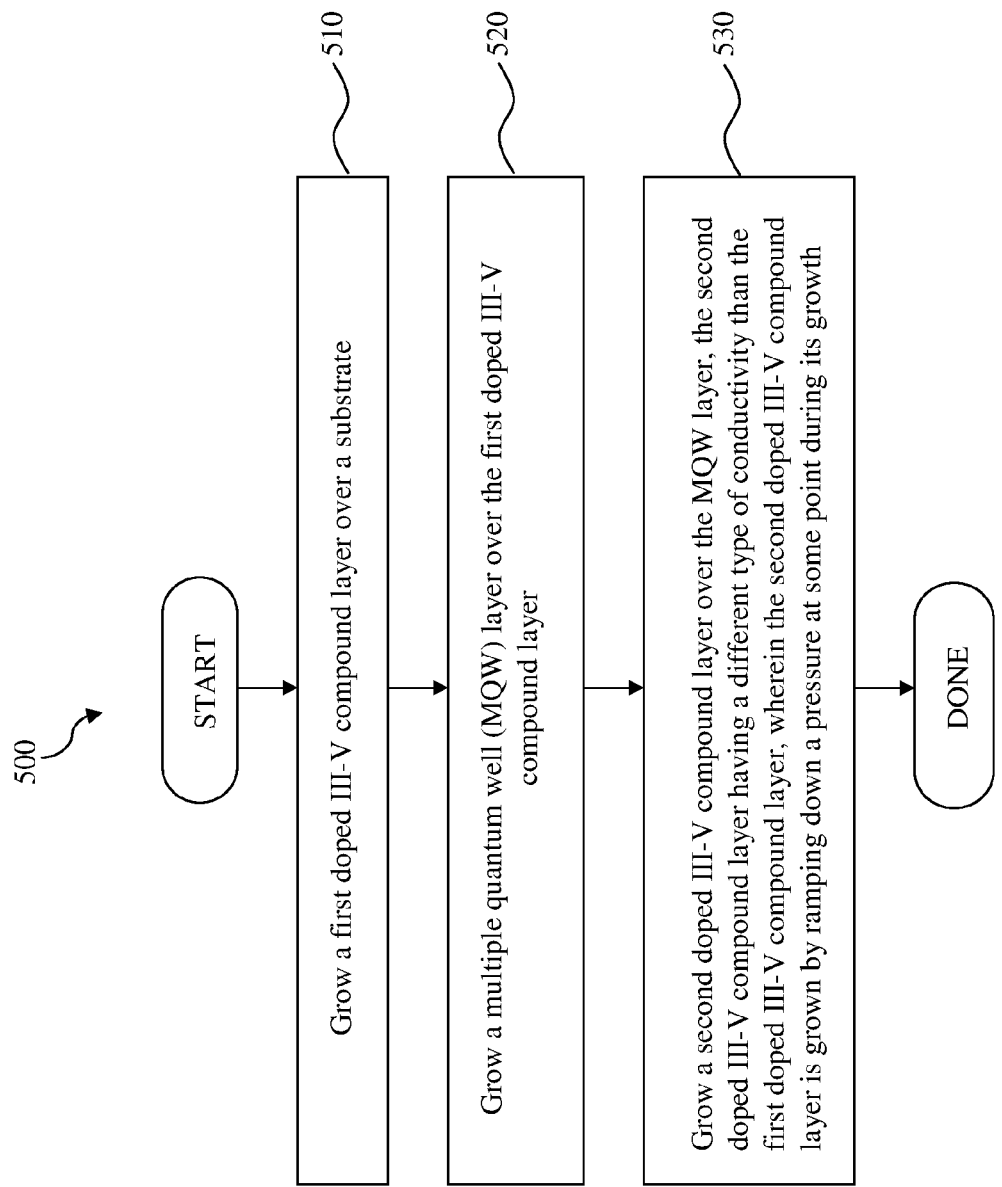
FIG. 11 is a flowchart illustrating a method of fabricating an LED according to various aspects of the present disclosure.

FIG. 11 is a flowchart of a method 500 for fabricating a photonic device according to various aspects of the present disclosure. Referring to FIG. 11, the method 500 includes a block 510, in which a first doped III-V compound layer is grown over a substrate. In some embodiments, the first doped III-V compound layer is an n-type doped gallium nitride (n-GaN) layer, and the substrate is a sapphire substrate. The method 500 includes a block 520, in which a multiple quantum well (MQW) layer is grown over the first doped III-V compound layer.

The method 500 includes a block 530, in which a second doped III-V compound layer is formed over the MQW layer by ramping down a pressure at some point during its growth. The second doped III-V compound layer has a different type of conductivity than the first doped III-V compound layer. In some embodiments, the second doped III-V compound layer is a p-type doped gallium nitride (p-GaN) layer. In some embodiments, the p-GaN layer is grown in two stages, where a first portion of the p-GaN layer is grown in the first stage using a first pressure. The first portion of the p-GaN layer has a substantially linear doping concentration curve. A second portion of the p-GaN layer is grown in the second stage using a second pressure. The second portion of the p-GaN layer has a substantially exponential doping concentration curve. The first portion of the p-GaN layer is at least several times thicker than the second portion of the p-GaN layer. The first portion of the p-GaN layer also has a substantially lower doping concentration level than the second portion.

It is understood that additional processes may be performed before, during, or after the blocks 510-530 discussed herein to complete the fabrication of the photonic device. For example, in some embodiments, after the block 530 is executed, a metal layer is formed over the second doped layer. The metal layer is bonded to a submount. Thereafter, the substrate is removed to expose the first doped III-V compound layer. A surface of the first doped III-V compound layer is roughened. Thereafter, one or more metal contacts is formed on the roughened surface of the first doped III-V compound layer. Other processes are not discussed in detail herein for reasons of simplicity.

Figure 12:
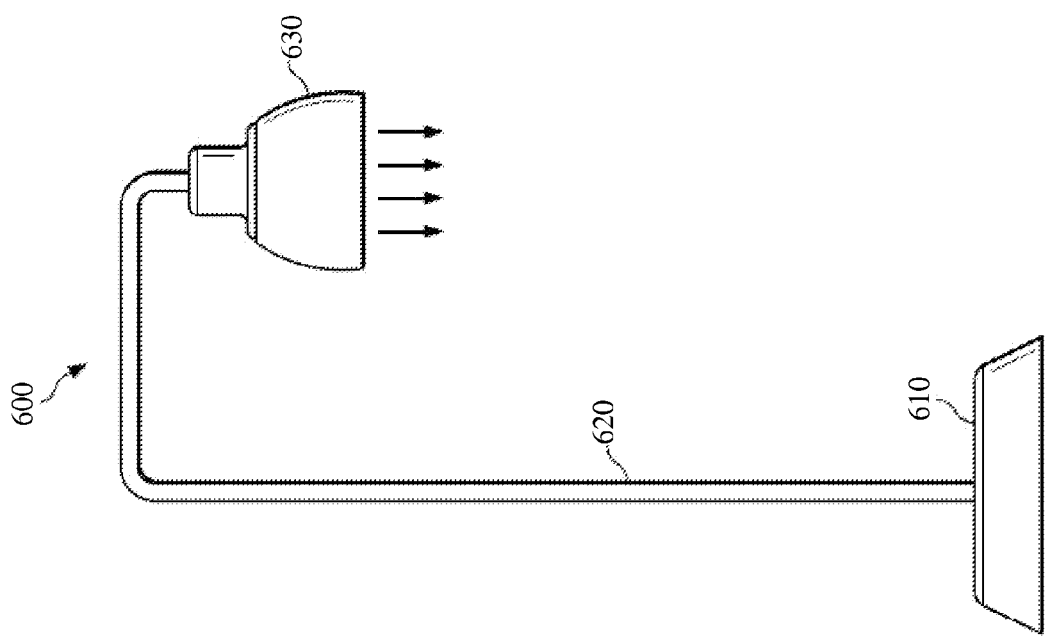
FIG. 12 is a diagrammatic view of a lighting module that includes the LED of FIGS. 1-10 according to various aspects of the present disclosure.

FIG. 12 illustrates a simplified diagrammatic view of a lighting module 600 that includes LEDs fabricated according to the various aspects of the present disclosure discussed above. The lighting module 600 has a base 610, a body 620 attached to the base 610, and a lamp 630 attached to the body 620. In some embodiments, the lamp 630 is a down lamp (or a down light lighting module). In other embodiments, the lamp 630 may be other suitable light fixtures. The lamp 630 uses LEDs discussed above with reference to FIGS. 1-11 as its light source. In other words, the LEDs of the lamp 630 of the lighting module 600 is a vertical LED that contains a p-GaN layer, wherein the p-GaN layer has a P− layer and a P+ layer, and the P+ layer is formed by ramping down the pressure during its formation. Consequently, the P+ layer has an exponential doping concentration profile.

The LEDs discussed according to the embodiments disclosed herein offer advantages over existing LEDs. It is understood, however, that not all advantages are necessarily discussed herein, and different embodiments may offer additional advantages, and that no particular advantage is required for all embodiments.

One advantage is that the light output power of the LED is improved. As discussed above, a substantial majority of the p-GaN layer is formed to have a relatively low doping concentration level. The low doping concentration level leads to reduced defects, which means that light absorption in the p-GaN layer is minimized. As such, more light can be reflected and propagate outside the LED die without being absorbed, thereby enhancing its light output power performance.

Another advantage is that the contact or sheet resistance of the LED die is reduced. The surface portion of the p-GaN layer (i.e., the P+ layer) is doped by ramping down the pressure, which increases its doping concentration level exponentially. In other words, the P+ layer is doped with a higher doping concentration level, which makes it a better interface with the metal layers formed thereon. As such, the contact or sheet resistance is reduced. The forward voltage is also reduced for substantially similar reasons. Furthermore, due to the greater doping concentration level, the P+ layer has high carrier mobility, which corresponds to improved current spreading capabilities.

One of the broader forms of the present disclosure involves a lighting apparatus. The lighting apparatus includes a photonic die that includes: a first doped III-V compound layer having a first type of conductivity; a second doped III-V compound layer having a second type of conductivity different from the first type of conductivity; and a multiple quantum well (MQW) layer disposed between the first and second doped III-V compound layers; wherein the first III-V compound layer has a doping concentration curve that includes an exponential segment.

In some embodiments, the first doped III-V compound layer is a p-type doped gallium nitride (p-GaN) layer; and the first doped III-V compound layer is doped with magnesium (Mg).

In some embodiments, the doping concentration curve is a function of depth.

In some embodiments, the doping concentration curve further includes an approximately linear segment. In some embodiments, the first III-V compound layer include a first portion and a second portion, the first portion being disposed closer to the MQW layer than the second portion; the approximately linear segment of the doping concentration curve corresponds to the first portion of the first III-V compound layer; and the exponential segment of the doping concentration curve corresponds to the second portion of the first III-V compound layer. In some embodiments, the first portion is at least several times thicker than the second portion.

In some embodiments, the exponential segment has a doping concentration level in a range from about $1.5 \times 10^{19}$ ions/centimeter$^3$ to about $1.5 \times 10^{20}$ ions/centimeter$^3$; and the approximately linear segment has a doping concentration level in a range from about $1.0 \times 10^{19}$ ions/centimeter$^3$ to about $1.5 \times 10^{19}$ ions/centimeter$^3$.

In some embodiments, the photonic die includes a vertical light-emitting diode (LED) die.

In some embodiments, the lighting apparatus further includes a lighting module in which the photonic die is implemented.

Yet another one of the broader forms of the present disclosure involves an LED. The LED includes: a substrate; a p-doped III-V compound layer and an n-doped III-V compound layer each disposed over the substrate; and a multiple quantum well (MQW) layer disposed between the p-doped III-V compound layer and the n-doped III-V compound layer; wherein the p-doped III-V compound layer includes a first region having a non-exponential doping concentration characteristic and a second region having an exponential doping concentration characteristic.

In some embodiments, the first region of the p-doped III-V compound layer is located closer to the MQW layer than the second region of the p-doped III-V compound layer.

In some embodiments, the p-doped III-V compound layer contains a gallium nitride material; the first region of the p-doped III-V compound layer has a doping concentration level in a range from about $1.0 \times 10^{19}$ ions/centimeter$^3$ to about $1.5 \times 10^{19}$ ions/centimeter$^3$; and the second region of the p-doped III-V compound layer has a doping concentration level in a range from about $1.5 \times 10^{19}$ ions/centimeter$^3$ to about $1.5 \times 10^{20}$ ions/centimeter$^3$.

In some embodiments, the non-exponential doping concentration characteristic includes a substantially linear doping concentration curve.

In some embodiments, a depth of the first region exceeds a depth of the second region by a number of times.

In some embodiments, the LED is a vertical LED; and the substrate is a gallium nitride substrate, a silicon submount, a ceramic submount, or a metal submount.

Yet one more of the broader forms of the present disclosure involves a method of fabricating an LED. The method includes: growing a first doped III-V compound layer over a substrate; growing a multiple quantum well (MQW) layer over the first doped III-V compound layer; and growing a second doped III-V compound layer over the MQW layer, the second doped III-V compound layer having a different type of conductivity than the first doped III-V compound layer; wherein the growing the second doped III-V compound layer includes ramping down a pressure at some point during the growing of the second doped III-V compound layer.

In some embodiments, the second doped III-V compound layer is a p-type doped gallium nitride compound layer, and wherein the growing the second doped III-V compound layer comprises: growing a first portion of the second III-V compound layer using a first pressure, such that the first portion has a substantially linear doping concentration curve; and growing a second portion of the second III-V compound layer using a second pressure lower than the first pressure, such that the second portion has a substantially exponential doping concentration curve. In some embodiments, the first portion is multiple times thicker than the second portion. In some embodiments, the first portion has a substantially lower doping concentration level than the second portion.

In some embodiments, the method further includes, after the growing the second doped III-V compound layer: forming a metal layer over the second doped layer; bonding the metal layer to a submount; thereafter removing the substrate to expose the first doped III-V compound layer; roughening a surface of the first doped III-V compound layer; and forming one or more metal contacts on the roughened surface of the first doped III-V compound layer.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A device, comprising:
a first doped III-V compound layer having a first type of conductivity;
a second doped III-V compound layer having a second type of conductivity different from the first type of conductivity; and
a multiple quantum well (MQW) layer disposed between the first and second doped III-V compound layers, wherein a disposition of the MQW layer relative to the first doped III-V compound layer allows a dopant from the first doped III-V compound layer to diffuse into the MQW layer;
wherein the first III-V compound layer has a doping concentration curve that includes a single exponential segment and an approximately linear segment, and wherein a highest point of the exponential segment corresponds to a boundary of the first III-V compound layer farther from the MQW layer, and wherein the approximately linear segment corresponds to a portion of the first III-V compound layer adjacent to the MQW layer, and
wherein the doping concentration curve is a function, of depth in a manner such that the doping concentration of the first III-V compound layer continuously decreases as the depth increases.

2. The device of claim 1, wherein:
the first doped III-V compound layer is a p-type doped gallium nitride (p-GaN) layer; and
the first doped III-V compound layer is doped with magnesium (Mg).

3. The device of claim 1, wherein:
the first III-V compound layer include a first portion and a second portion, the first portion being disposed closer to the MQW layer than the second portion;
the approximately linear segment of the doping concentration curve corresponds to the first portion of the first III-V compound layer; and
the exponential segment of the doping concentration curve corresponds to the second portion of the first III-V compound layer.

4. The device of claim 3, wherein the first portion is at least several times thicker than the second portion.

5. The device of claim 1, wherein:
the exponential segment has a doping concentration level in a range from about $1.5 \times 10^{19}$ ions/centimeter$^3$ to about $1.5 \times 10^{20}$ ions/centimeter$^3$; and
the approximately linear segment has a doping concentration level in a range from about $1.0 \times 10^{19}$ ions/centimeter$^3$ to about $1.5 \times 10^{19}$ ions/centimeter$^3$.

6. The device of claim 1, wherein the device includes a vertical light-emitting diode (LED) die.

7. The device of claim 1, further comprising: a lighting module in which the first and second doped III-V compound layers and the MQW layer are implemented.

8. A light-emitting diode (LED), comprising:
a substrate;
a p-doped III-V compound layer and an n-doped compound layer each disposed over the substrate; and
a multiple quantum well (MQW) layer disposed between the p-doped III-V compound layer and the n-doped III-V compound layer, wherein a disposition of the MQW layer relative to the p-doped III-V compound layer allows a dopant from the p-doped III-V compound layer to diffuse into the MQW layer,
wherein the p-doped III-V compound layer and the n-doped III-V compound layer are free of having a capping layer therebetween,
wherein the p-doped III-V compound layer includes a first region having an approximately linear doping concentration characteristic and a second region having an exponential doping concentration characteristic,
wherein the first region of the p-doped compound layer is adjacent to the MQW layer,
wherein the first region is defined from a first surface of the p-doped III-V compound layer,
wherein the second region is defined from a second surface of the p-doped III-V compound layer opposite the first surface, and
wherein a part of the second region at the second surface of the p-doped III-V compound layer has a greatest doping concentration and wherein a doping concentration level of the p-doped III-V compound layer continuously decreases from the second surface to the first surface.

9. The LED of claim 8, wherein:
the p-doped III-V compound layer contains a gallium nitride material;
the first region of the p-doped III-V compound layer has a doping concentration level in a range from about $1.0 \times 10^{19}$ ions/centimeter$^3$ to about $1.5 \times 10^{19}$ ions/centimeter$^3$ and the second region of the p-doped III-V compound layer has a doping concentration level in a range from about $1.5 \times 10^{19}$ ions/centimeter$^3$ to about $1.5 \times 10^{20}$ ions/centimeter$^3$.

10. The LED of claim 8, wherein a depth of the first region exceeds a depth of the second region by a number of times.

11. The LED of claim 8, wherein:
the LED is a vertical LED; and
the substrate is a gallium nitride substrate, a silicon submount, a ceramic submount, or a metal submount.

12. A device, comprising:
a first doped gallium nitride layer;
a multiple quantum well (MQW) layer disposed over the first doped gallium nitride layer;
a second doped gallium nitride layer disposed directly on the MOW layer, wherein the second doped gallium nitride layer includes a first portion with an approximately linear doping profile and a second portion with an approximately exponential doping profile, and wherein the first portion is adjacent to the MQW layer, and wherein a disposition of the MQW layer relative to the second doped gallium nitride lam allows a dopant from the second doped gallium nitride layer to diffuse into the MQW layer; and
a metal layer bonded to the second portion of the second doped gallium nitride layer, wherein the second portion has a greatest doping concentration level at an interface between the second portion and the metal layer, wherein a doping concentration level of the second doped gallium nitride layer continuously decreases from a first surface of the second doped gallium nitride layer bonded to the metal layer to a second surface of the second doped gallium nitride layer opposite the first surface.

13. The device of claim 12, wherein a doping concentration level of the second portion exponentially decreases as a function of a distance from the interface between the second portion and the metal layer.

14. The device of claim 12, wherein the first portion is at least multiple times thicker than the second portion.

15. The device of claim 12, wherein:
the first portion has a doping concentration level in a range from about $1.0 \times 10^{19}$ ions/centimeter$^3$ to about $1.5 \times 10^{19}$ ions/centimeter$^3$;
the second portion has a doping concentration level in a range from about $1.5 \times 10^{19}$ ions/centimeter$^3$ to about $1.5 \times 10^{20}$ ions/centimeter$^3$.

16. The device of claim 12, further comprising a lighting module in which the first doped gallium nitride layer, the MQW layer, and the second doped gallium nitride layer are disposed.

* * * * *